United States Patent
Iwakaji et al.

(10) Patent No.: US 11,335,771 B2
(45) Date of Patent: May 17, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoko Iwakaji, Meguro Tokyo (JP); Tomoko Matsudai, Shibuya Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/004,702

(22) Filed: Aug. 27, 2020

(65) Prior Publication Data

US 2021/0288143 A1 Sep. 16, 2021

(30) Foreign Application Priority Data

Mar. 13, 2020 (JP) .................................. 2020-043815

(51) Int. Cl.
*H01L 29/06* (2006.01)
*H01L 29/739* (2006.01)
*H01L 29/423* (2006.01)

(52) U.S. Cl.
CPC ...... *H01L 29/0696* (2013.01); *H01L 29/0623* (2013.01); *H01L 29/4236* (2013.01); *H01L 29/7397* (2013.01)

(58) Field of Classification Search
CPC ............. H01L 29/0696; H01L 29/7397; H01L 29/0623; H01L 29/4236; H01L 29/401; H01L 29/407; H01L 29/66348
See application file for complete search history.

(56) References Cited

U.S. PATENT DOCUMENTS

2011/0012171 A1* 1/2011 Kobayashi .......... H01L 29/0834
257/139
2011/0272708 A1* 11/2011 Yoshioka .......... H01L 21/28264
257/77

(Continued)

FOREIGN PATENT DOCUMENTS

JP 2013-84905 A 5/2013
JP 5594276 B2 9/2014

(Continued)

*Primary Examiner* — Shahed Ahmed
*Assistant Examiner* — Khatib A Rahman
(74) *Attorney, Agent, or Firm* — Allen & Overy LLP

(57) ABSTRACT

A semiconductor device includes first and second electrodes, a semiconductor part therebetween; first and second control electrodes each in a trench at the frontside of the semiconductor part. The semiconductor part includes first to sixth layers. The first and third layers are of a first conductivity type. Other layers are of a second conductivity type. The first layer extends between the first electrode at the backside and the second electrode at the frontside. The second layer is provided between the first layer and the second electrode. The third and fourth layers each are selectively provided between the second layer and the second electrode. The fifth layer is provided between the first layer and the first electrode. The sixth layer is provided between the first layer and the second control electrode. The sixth layer extends along an insulating film between the semiconductor part and the second control electrode.

16 Claims, 14 Drawing Sheets

(56) References Cited

U.S. PATENT DOCUMENTS

| | | | |
|---|---|---|---|
| 2012/0012929 A1* | 1/2012 | Saito | H01L 29/7813 |
| | | | 257/335 |
| 2012/0146091 A1 | 6/2012 | Tanabe et al. | |
| 2012/0217555 A1* | 8/2012 | Saito | H01L 29/42356 |
| | | | 257/288 |
| 2013/0146941 A1* | 6/2013 | Andou | H01L 29/866 |
| | | | 257/140 |
| 2014/0203356 A1* | 7/2014 | Kagata | H01L 29/1045 |
| | | | 257/330 |
| 2015/0200248 A1* | 7/2015 | Ono | H01L 29/7813 |
| | | | 257/330 |
| 2015/0262999 A1* | 9/2015 | Ogura | H01L 29/0834 |
| | | | 257/140 |
| 2016/0049509 A1* | 2/2016 | Tomita | H01L 29/4238 |
| | | | 257/331 |
| 2016/0071940 A1* | 3/2016 | Okumura | H01L 21/26586 |
| | | | 257/331 |
| 2016/0093719 A1* | 3/2016 | Kobayashi | H01L 29/66734 |
| | | | 257/330 |
| 2019/0081162 A1* | 3/2019 | Gejo | H01L 29/4236 |
| 2019/0096989 A1* | 3/2019 | Yoshida | H01L 29/0696 |
| 2019/0296133 A1 | 9/2019 | Iwakaji et al. | |
| 2019/0296134 A1 | 9/2019 | Matsudai et al. | |
| 2019/0326118 A1* | 10/2019 | Naito | H01L 29/32 |
| 2020/0091326 A1 | 3/2020 | Iwakaji et al. | |

FOREIGN PATENT DOCUMENTS

| | | |
|---|---|---|
| JP | 2019-169575 A | 10/2019 |
| JP | 2019-169597 A | 10/2019 |
| JP | 2020-047790 A | 3/2020 |

\* cited by examiner

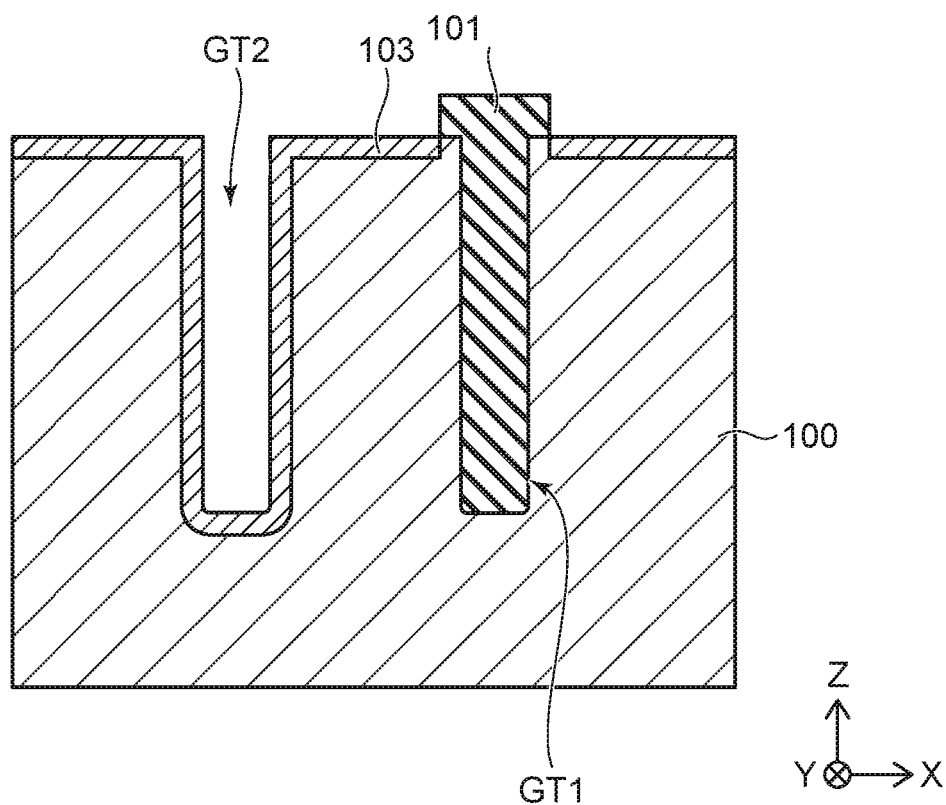
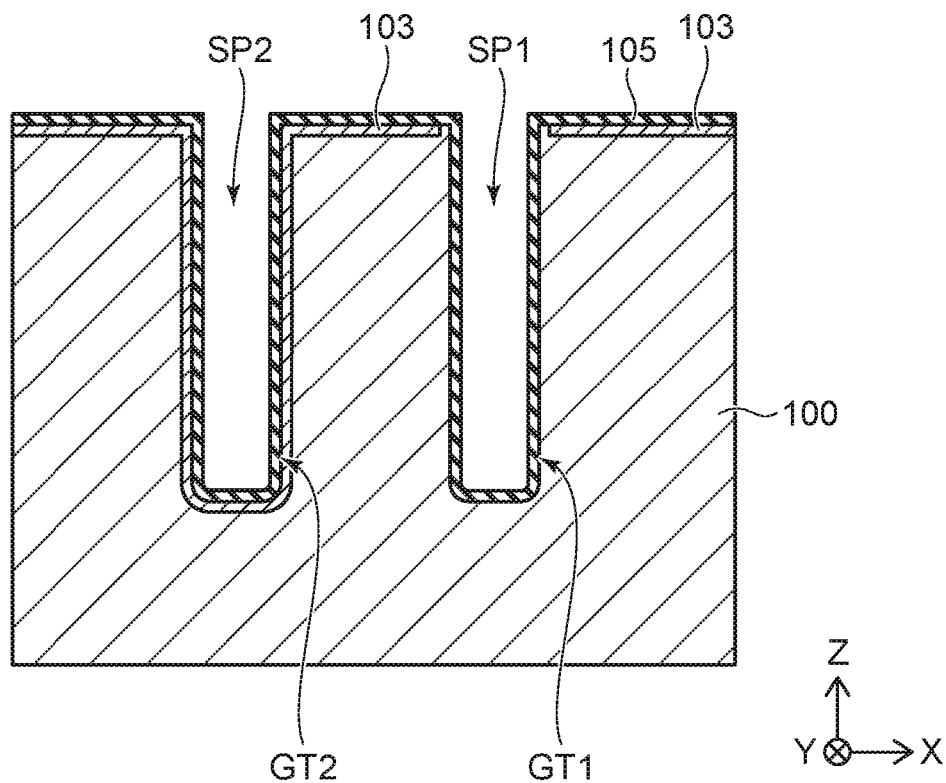

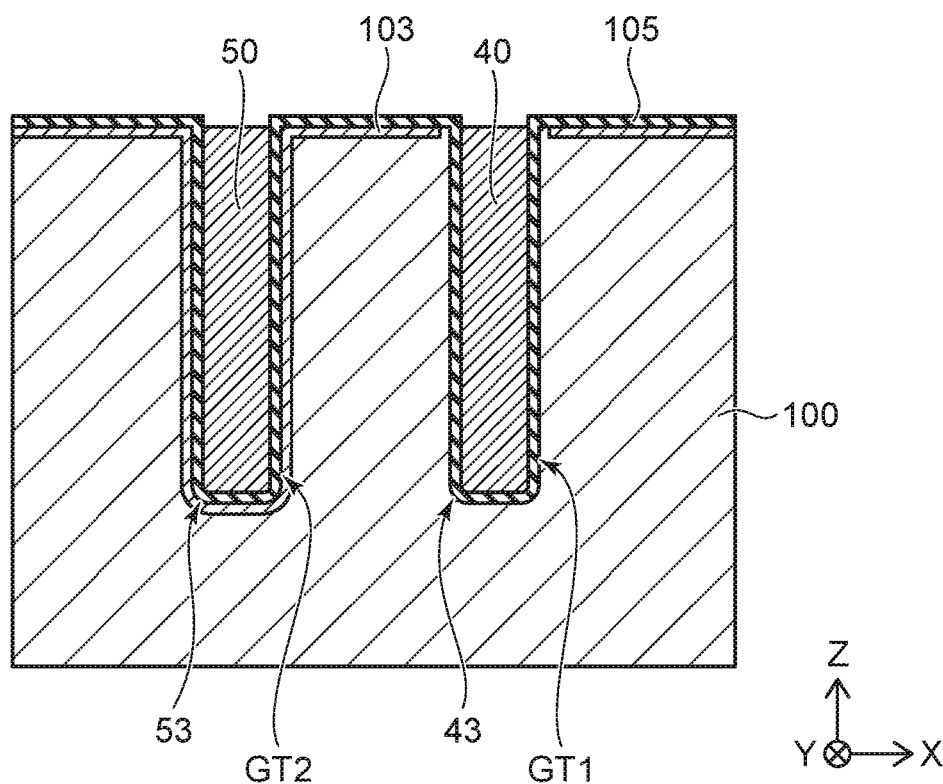
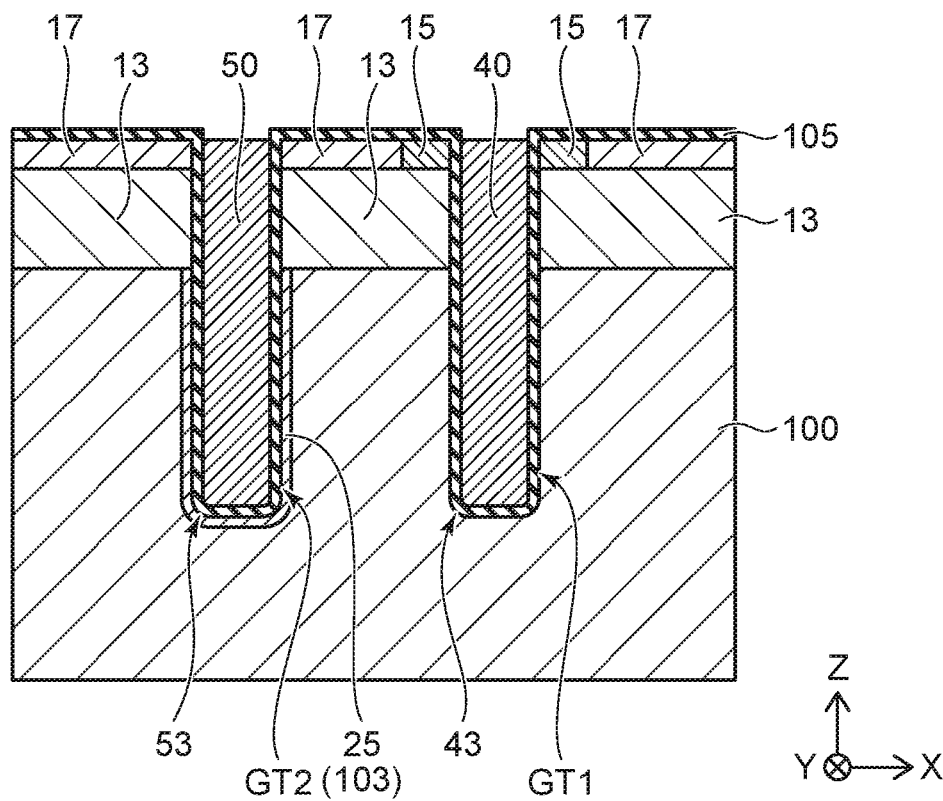

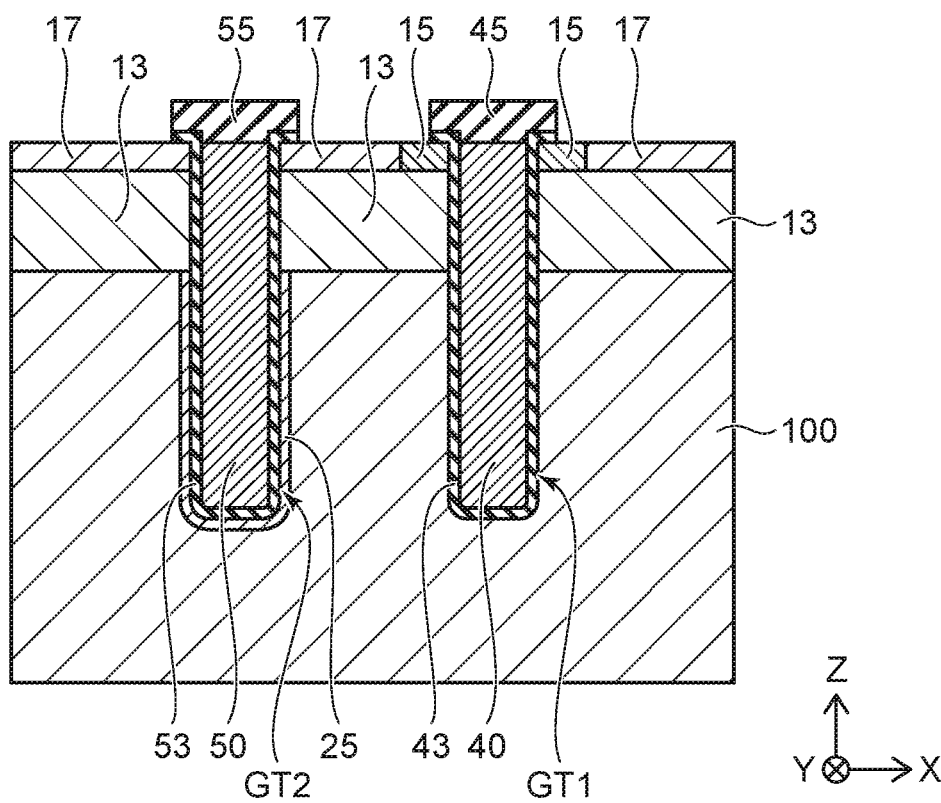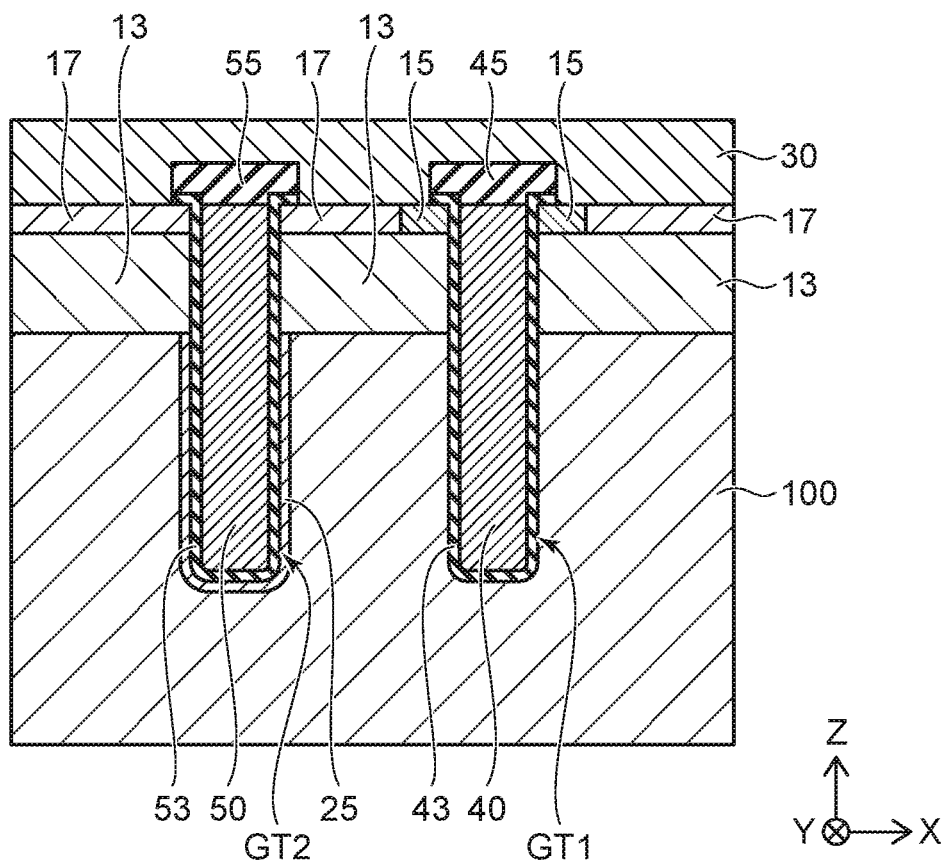

SEMICONDUCTOR DEVICE

CROSS-REFERENCE TO RELATED APPLICATIONS

This application is based upon and claims the benefit of priority from Japanese Patent Application No. 2020-043815, filed on Mar. 13, 2020; the entire contents of which are incorporated herein by reference.

FIELD

Embodiments relate to a semiconductor device.

BACKGROUND

It is desirable for a semiconductor device for power control to have characteristics of a low on-resistance and a small switching loss. For example, in an IGBT (Insulated gate Bipolar Transistor), the on-resistance can be reduced by increasing the density of holes injected from a p-type collector layer into an n-type base layer. However, as the hole density increases in the n-type base layer, it takes long time to eject the holes from the n-type base layer, resulting in an increase of the turn-off loss.

The IGBT comprising two control electrodes that are controlled independently is used to improve such a trade-off relation and reduce both the on-resistance and the turn-off loss. For example, the holes are partly pre-ejected from the n-type base layer by controlling the potential of one of the two control electrodes before turning off the IGBT, thus, reducing the hole density in the n-type base layer. Thereby, the ejection time of holes can be shortened while turning off the IGBT, and the switching loss can be reduced. However, some constraints must be eliminated in a circuit design to achieve such a gate control.

BRIEF DESCRIPTION OF DRAWINGS

FIGS. 2A to 5B are schematic cross-sectional views showing manufacturing processes of the semiconductor device according to a first embodiment;

DETAILED DESCRIPTION

Figure 1:
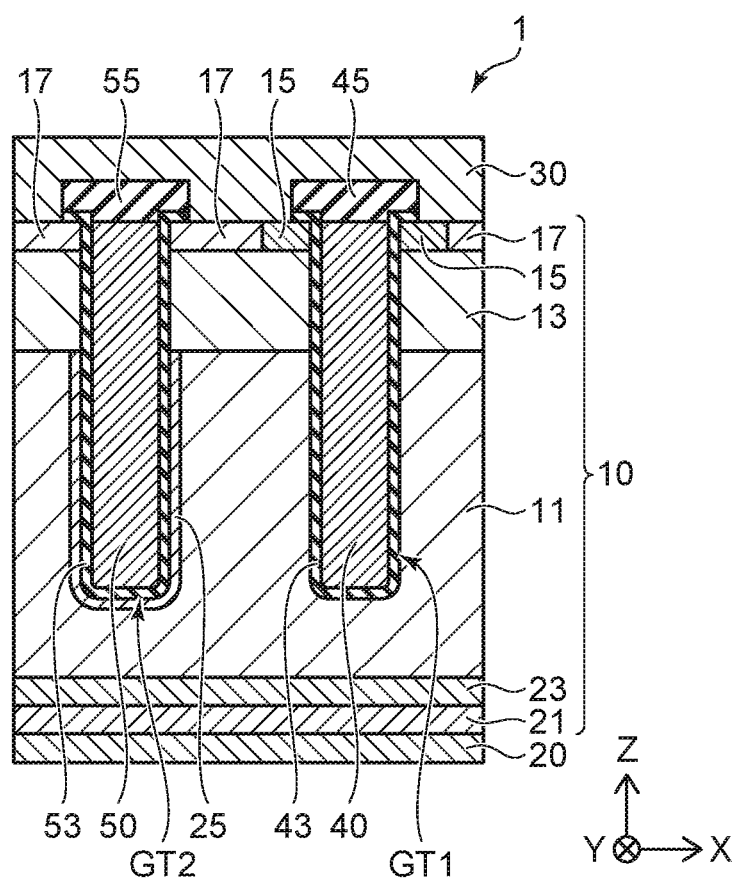
FIG. 1 is a schematic cross-sectional view showing a semiconductor device according to a first embodiment.

According to one embodiment, a semiconductor device includes a semiconductor part having first and second trenches at a front side; a first electrode provided at a backside of the semiconductor part; a second electrode provided at the front side of the semiconductor part; a first control electrode provided between the semiconductor part and the second electrode, the first control electrode provided in the first trench, the first control electrode being electrically insulated from the semiconductor part by a first insulating film and electrically insulated from the second electrode by a second insulating film; and a second control electrode provided between the semiconductor part and the second electrode, the second control electrode provided in the second trench, the second control electrode being electrically insulated from the semiconductor part by a third insulating film and electrically insulated from the second electrode by a fourth insulating film, the second control electrode being electrically isolated from the first control electrode. The semiconductor part includes a first semiconductor layer of a first conductivity type, a second semiconductor layer of a second conductivity type, a third semiconductor layer of the first conductivity type, a fourth semiconductor layer of the second conductivity type, a fifth semiconductor layer of the second conductivity type, and a sixth semiconductor layer of the second conductivity type. The first and second control electrodes extend into the first semiconductor layer. The second semiconductor layer is provided between the first semiconductor layer and the second electrode. The second semiconductor layer faces the first control electrode via the first insulating film and faces the second control electrode via the third insulating film. The third semiconductor layer is selectively provided between the second semiconductor layer and the second electrode. The third semiconductor layer contacts the first insulating film and is electrically connected to the second electrode. The fourth semiconductor layer is selectively provided between the second semiconductor layer and the second electrode. The fourth semiconductor layer contacts the third insulating film and is electrically connected to the second electrode. The fifth semiconductor layer is provided between the first semiconductor layer and the first electrode. The fifth semiconductor layer is electrically connected to the first electrode. The sixth semiconductor layer is provided between the first semiconductor layer and the second control electrode. The sixth semiconductor layer extends along the third insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is, for example, an IGBT including two types of control electrodes.

As shown in FIG. 1, the semiconductor device 1 includes a semiconductor part 10, a first electrode (hereinbelow, a collector electrode 20), a second electrode (hereinbelow, an emitter electrode 30), a first control electrode 40, and a second control electrode 50. The collector electrode 20 is provided at the backside of the semiconductor part 10. The emitter electrode 30 is provided at the front side of the semiconductor part 10.

The first control electrode 40 and the second control electrode 50 are disposed between the semiconductor part 10 and the emitter electrode 30 respectively inside gate trenches GT1 and GT2 provided in the semiconductor part 10. The first control electrode 40 and the second control electrode 50 are separated from each other.

The first control electrode 40 is electrically insulated from the semiconductor part 10 by an insulating film 43. Also, the first control electrode 40 is electrically insulated from the emitter electrode 30 by an insulating film 45.

The second control electrode 50 is electrically insulated from the semiconductor part 10 by an insulating film 53. Also, the second control electrode 50 is electrically insulated from the emitter electrode 30 by an insulating film 55.

The semiconductor part 10 includes a first semiconductor layer (hereinbelow, an n-type base layer 11), a second semiconductor layer (hereinbelow, a p-type base layer 13), a third semiconductor layer (hereinbelow, an n-type emitter layer 15), a fourth semiconductor layer (hereinbelow, a p-type contact layer 17), a fifth semiconductor layer (a p-type collector layer 21), an n-type buffer layer 23, and a sixth semiconductor layer (hereinbelow, a p-type charge-ejecting layer 25).

The n-type base layer 11 extends between the collector electrode 20 and the emitter electrode 30. The n-type base layer 11 extends in the entire semiconductor part 10. The first control electrode 40 and the second control electrode 50 extend in a direction (a −Z direction) from the emitter electrode 30 toward the collector electrode 20 and extend into the n-type base layer 11.

The p-type base layer 13 is provided between the n-type base layer 11 and the emitter electrode 30. The p-type base layer 13 faces the first control electrode 40 via the insulating film 43. Also, the p-type base layer 13 faces the second control electrode 50 via the insulating film 53.

The n-type emitter layer 15 is selectively provided between the p-type base layer 13 and the emitter electrode 30. The n-type emitter layer 15 contacts the insulating film 43. The n-type emitter layer 15 is electrically connected to the emitter electrode 30. The n-type emitter layer 15 includes an n-type impurity with a higher concentration than the n-type impurity concentration of the n-type base layer 11.

The p-type contact layer 17 is selectively provided between the p-type base layer 13 and the emitter electrode 30. For example, the p-type contact layer 17 contacts the insulating film 53. The p-type contact layer 17 is electrically connected to the emitter electrode 30. The p-type contact layer 17 includes a p-type impurity with a higher concentration than the p-type impurity concentration of the p-type base layer 13.

The p-type collector layer 21 is provided between the n-type base layer 11 and the collector electrode 20. The p-type collector layer 21 is electrically connected to the collector electrode 20.

The n-type buffer layer 23 is provided between the n-type base layer 11 and the p-type collector layer 21. The n-type buffer layer 23 includes an n-type impurity with a higher concentration than the n-type impurity concentration of the n-type base layer 11.

The p-type charge-ejecting layer 25 is provided between the n-type base layer 11 and the second control electrode 50. The p-type charge-ejecting layer 25 extends along the insulating film 53. For example, the p-type charge-ejecting layer 25 covers the entire portion of the second control electrode 50 that extends into the n-type base layer 11. For example, the p-type charge-ejecting layer 25 includes a p-type impurity with substantially the same concentration as the p-type impurity concentration in the p-type base layer 13 or with a lower concentration than the p-type impurity concentration in the p-type base layer 13.

A method for manufacturing the semiconductor device 1 according to the first embodiment will now be described with reference to FIGS. 2A to 5B. FIGS. 2A to 5B are schematic cross-sectional views showing manufacturing processes of the semiconductor device 1.

Figure 2A:
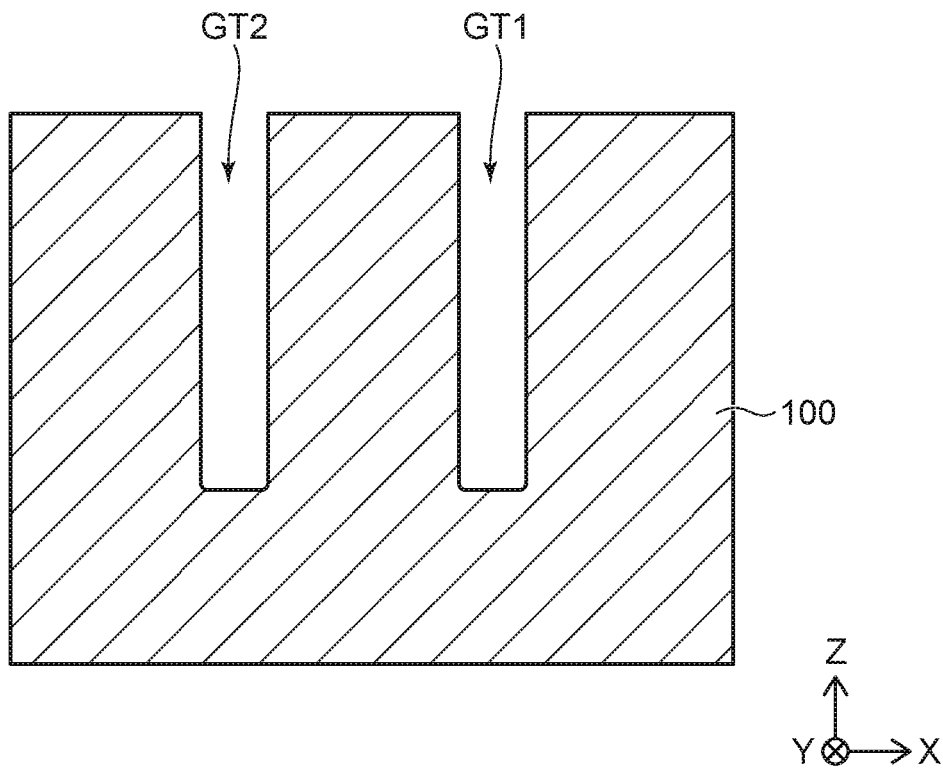

As shown in FIG. 2A, a gate trench GT1 and a gate trench GT2 are formed in the front side of a semiconductor wafer 100. The semiconductor wafer 100 is, for example, an n-type silicon wafer. The semiconductor wafer 100 includes an n-type impurity with the same concentration as the n-type impurity concentration of the n-type base layer 11. For example, the gate trenches GT1 and GT2 are formed by selectively etching the semiconductor wafer 100 by using anisotropic RIE (Reactive Ion Etching).

Figure 2B:
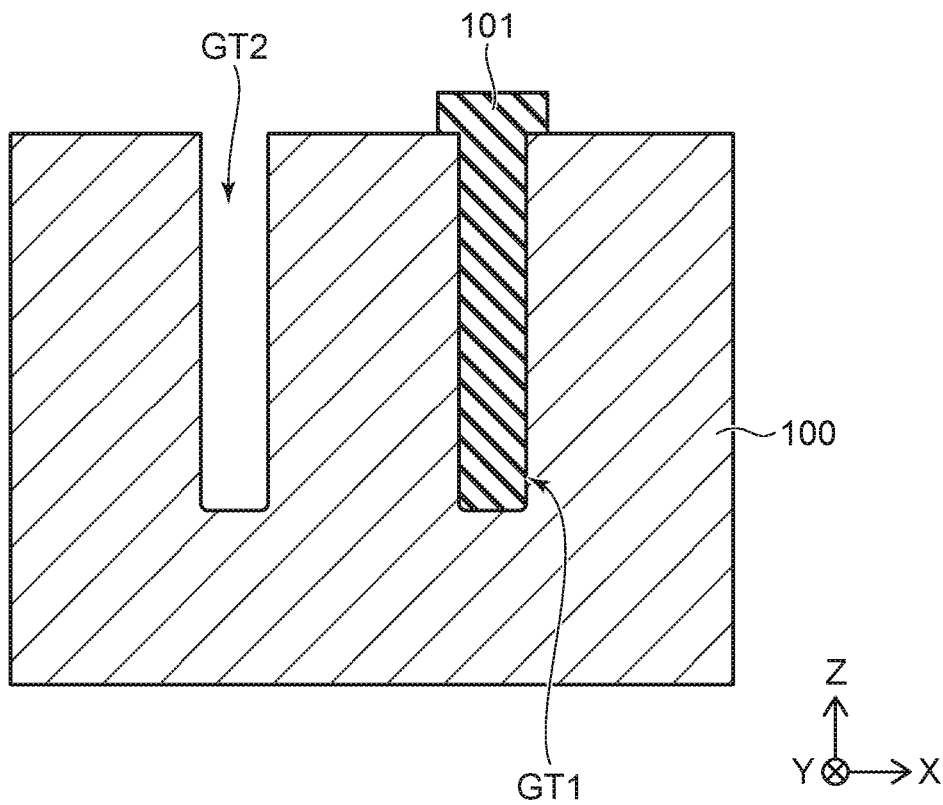

As shown in FIG. 2B, an insulating film 101 is formed inside the gate trench GT1. The insulating film 101 is, for example, a silicon oxide film formed using CVD (Chemical Vapor Deposition).

For example, the insulating film 101 is formed to cover the front surface of the semiconductor wafer 100 and fill the spaces inside the gate trenches GT1 and GT2. Subsequently, the insulating film 101 is selectively removed so that a portion of the insulating film 101 remains in the space inside the gate trench GT1.

As shown in FIG. 3A, a p-type diffusion layer 103 is formed on the exposed surface of the semiconductor wafer 100. The p-type diffusion layer 103 is formed along the inner surface of the gate trench GT2, but is not formed inside the gate trench GT1 filled with the insulating film 101.

For example, the p-type diffusion layer 103 is formed by diffusing a p-type impurity such as boron (B) into the semiconductor wafer 100. For example, the p-type diffusion layer 103 is formed using vapor phase diffusion.

As shown in FIG. 3B, after removing the insulating film 101, an insulating film 105 that covers the inner surface of the gate trench GT1 and the inner surface of the gate trench GT2 is formed. The insulating film 105 is formed so that spaces SP1 and SP2 remain inside the gate trenches GT1 and GT2. Also, the insulating film 105 is formed so that a portion of the p-type diffusion layer 103 remains between the semiconductor wafer 100 and the insulating film 105. For example, the insulating film 105 is formed by thermal oxidation of the semiconductor wafer 100. The insulating film 105 is, for example, a silicon oxide film. The insulating film 105 includes, for example, the p-type impurity such as boron (B) at the portion where thermal oxidation of the p-type diffusion layer 103 is performed.

As shown in FIG. 4A, the first control electrode 40 is formed inside the gate trench GT1, and the second control electrode 50 is formed inside the gate trench GT2. The first control electrode 40 and the second control electrode 50 are, for example, conductive polysilicon.

For example, a polysilicon layer is formed at the front side of the semiconductor wafer 100 to fill the spaces SP1 and SP2 of the gate trenches GT1 and GT2. The polysilicon layer is formed using CVD, and then, is provided with conductivity by diffusing an n-type impurity such as phosphorus (P). The first control electrode 40 and the second control electrode 50 are formed by removing the polysilicon film so that portions thereof remain in the spaces SP1 and SP2.

The insulating film 105 includes a portion which is the insulating film 43 positioned between the first control electrode 40 and the semiconductor wafer 100. The insulating film 105 includes another portion which is the insulating film 53 positioned between the second control electrode 50 and the semiconductor wafer 100.

As shown in FIG. 4B, the p-type base layer 13, the n-type emitter layer 15, and the p-type contact layer 17 are formed at the front side of the semiconductor wafer 100. The p-type diffusion layer 103 includes portions joined with the p-type base layer 13 and the p-type contact layer 17. The n-type emitter layer 15 includes other portion of the p-type diffusion layer 103 that is inverted to the n-type. The remaining portion of the p-type diffusion layer 103 is the p-type charge-ejecting layer 25 which covers the portion of the second control electrode 50 extending into the n-type base layer 11.

For example, the p-type base layer 13 is formed by ion-implanting a p-type impurity such as boron (B) into the front side of the semiconductor wafer 100. Then, the implanted p-type impurity is activated and diffused by heat treatment. The p-type base layer 13 is formed to have a prescribed depth from the front surface of the semiconductor wafer 100.

For example, the n-type emitter layer 15 is formed by ion-implanting an n-type impurity such as phosphorus (P) into the front side of the semiconductor wafer 100 and by activating the implanted n-type impurity. The n-type emitter layer 15 is formed so that the depth from the front surface of the semiconductor wafer 100 is shallower than the depth of the p-type base layer 13. The n-type emitter layer 15 includes an n-type impurity with a higher concentration than the concentration of the p-type impurity in the p-type base layer 13.

For example, the p-type contact layer 17 is formed by selectively ion-implanting a p-type impurity such as boron (B) into the front side of the semiconductor wafer 100 and by activating the implanted p-type impurity. The p-type contact layer 17 is formed so that the depth from the front surface of the semiconductor wafer 100 is shallower than the depth of the p-type base layer 13. For example, the p-type contact layer 17 includes a p-type impurity with a higher concentration than the concentration of the n-type impurity of the n-type emitter layer 15. For example, the p-type contact layer 17 is formed so that the p-type contact layer 17 contacts the insulating film 53, and the n-type emitter layer 15 remains at a position contacting the insulating film 43.

As shown in FIG. 5A, the insulating film 45 and the insulating film 55 are formed at the front side of the semiconductor wafer 100. The insulating film 45 covers the upper surface of the first control electrode 40, and the insulating film 55 covers the upper surface of the second control electrode 50. The insulating films 45 and 55 are formed, for example, after a silicon oxide film covering the front side of the semiconductor wafer 100 is formed using CVD. The silicon oxide film is selectively removed so that portions thereof remain on the first control electrode 40 and the second control electrode 50, respectively.

As shown in FIG. 5B, the emitter electrode 30 is formed at the front side of the semiconductor wafer 100. The emitter electrode 30 covers the insulating film 45 and the insulating film 55. The emitter electrode 30 contacts the n-type emitter layer 15 and the p-type contact layer 17. The emitter electrode 30 is, for example, a metal layer including aluminum (Al).

Continuing, the semiconductor wafer 100 is thinned to a prescribed wafer thickness by polishing or etching the backside of the semiconductor wafer 100. The n-type buffer layer 23 and the p-type collector layer 21 are formed at the backside of the semiconductor wafer 100 (referring to FIG. 1). For example, the n-type buffer layer 23 and the p-type collector layer 21 are formed by ion-implanting an n-type impurity such as phosphorus (P) and a p-type impurity such as boron (B) into the backside of the semiconductor wafer 100 and by activating the p-type and n-type impurities. The collector electrode 20 is formed on the p-type collector layer 21 at the backside of the semiconductor wafer 100 (referring to FIG. 1). The collector electrode 20 is, for example, a metal layer including aluminum (Al).

Figure 6A:
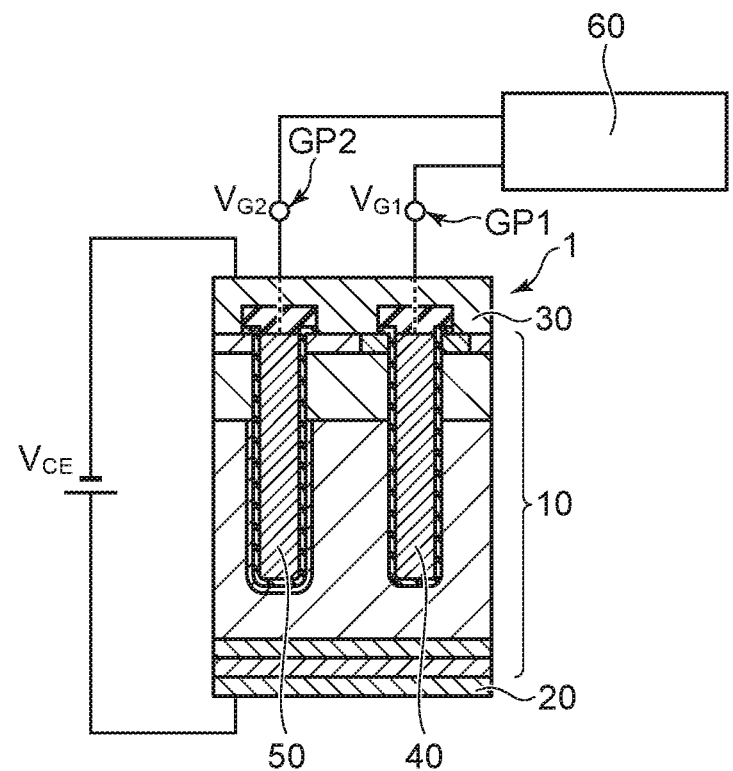
FIGS. 6A to 6C are schematic views showing a method for controlling the semiconductor device according to the first embodiment.
Figure 6B:
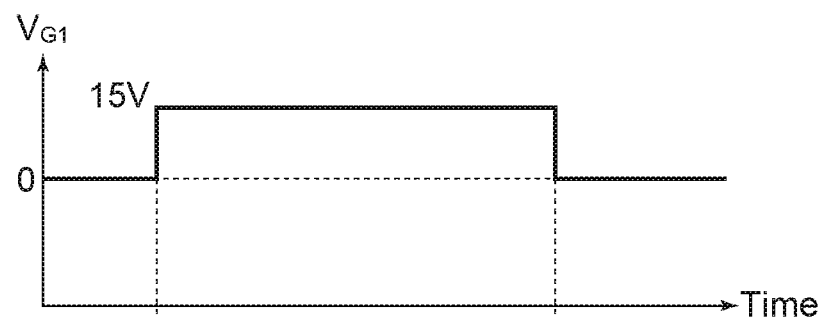
Figure 6C:
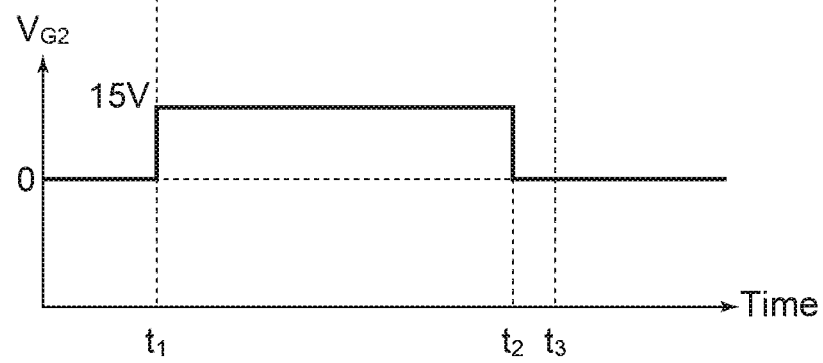

FIGS. 6A to 6C are schematic views showing a method for controlling the semiconductor device 1 according to the first embodiment. FIG. 6A is a schematic view showing a method for applying biases to the first control electrode 40 and the second control electrode 50 while operating the semiconductor device 1. FIG. 6B is a time chart showing a first gate voltage $V_{G1}$ applied between the first control electrode 40 and the emitter electrode 30. FIG. 6C is a time chart showing a second gate voltage $V_{G2}$ applied between the second control electrode 50 and the emitter electrode 30.

As shown in FIG. 6A, the semiconductor device 1 includes, for example, a first terminal GP1 electrically connected to the first control electrode 40, and a second terminal GP2 electrically connected to the second control electrode 50. The first terminal GP1 and the second terminal GP2 are, for example, gate pads provided at the front side of the semiconductor part 10.

The first terminal GP1 and the second terminal GP2 are electrically isolated from each other. The first terminal GP1 and the second terminal GP2 are electrically insulated from the semiconductor part 10 and the emitter electrode 30. For example, the first gate voltage $V_{G1}$ is applied from a gate control circuit 60 to the first control electrode 40 via the first terminal GP1. For example, the second gate voltage $V_{G2}$ is applied from the gate control circuit 60 to the second control electrode 50 via the second terminal GP2. A collector voltage $V_{CE}$ is applied between the collector electrode 20 and the emitter electrode 30.

As shown in FIG. 6B, for example, the first gate voltage $V_{G1}$ is controlled such as increasing to a second voltage from a first voltage at a time $t_1$ and decreasing from the second voltage to the first voltage at a time $t_3$ after the time $t_1$, here, the first voltage is, for example, zero (0) V, and the second voltage is, for example, positive 15 V. The first voltage is lower than the threshold voltage of the first control electrode 40, and the second voltage is equal to or higher than the threshold voltage of the first control electrode 40. In other words, the first control electrode 40 is controlled to turn-on the semiconductor device 1 at the time $t_1$ and turn-off the semiconductor device 1 at the time $t_3$.

The second gate voltage $V_{G2}$ shown in FIG. 6C is controlled such as increasing from the first voltage to the second voltage at the time $t_1$ and decreasing from the second voltage to the first voltage at a time $t_2$ between the time $t_1$ and the time $t_3$. The first voltage is not more than a threshold voltage of the second control electrode 50 at which the entire p-type charge-ejecting layer 25 is inverted to the n-type. The second voltage is not lower than the threshold voltage of the second control electrode. From the time $t_2$ to the time $t_3$, the semiconductor device 1 is in a preliminary period for the turn-off, and is in a turned-on state.

In the control method described above, the first voltage is not limited to 0 V, but may be positive voltages lower than the threshold voltages of the first control electrode 40 and the second control electrode 50.

Figure 7A:
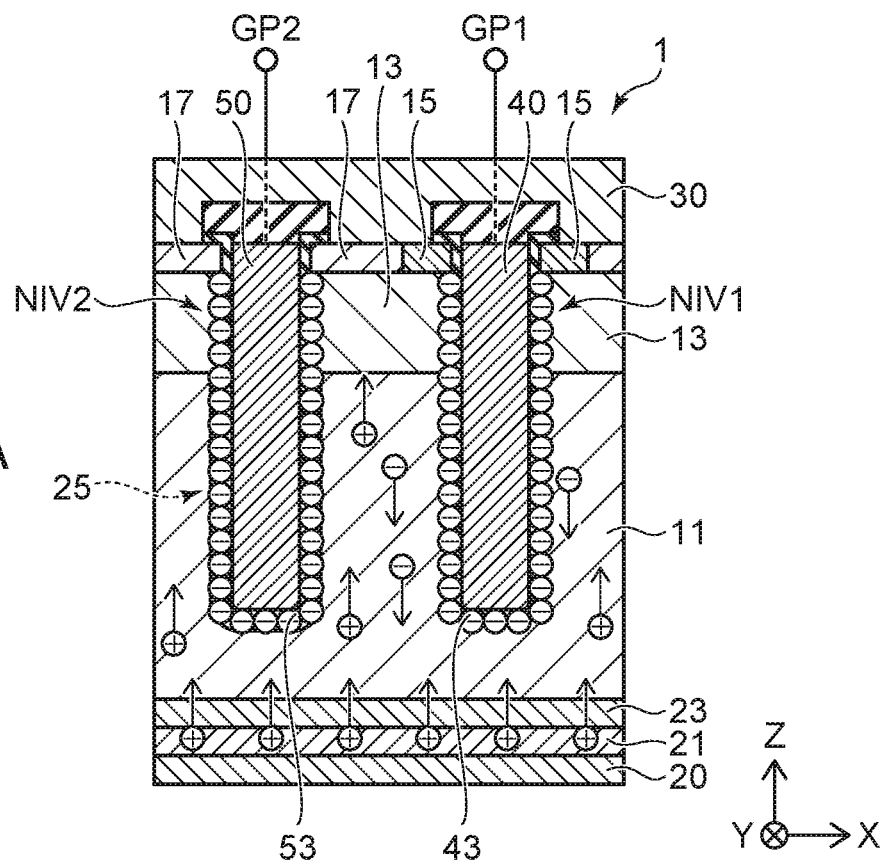
FIGS. 7A and 7B are schematic cross-sectional views showing an operation of the semiconductor device according to the first embodiment.
Figure 7B:
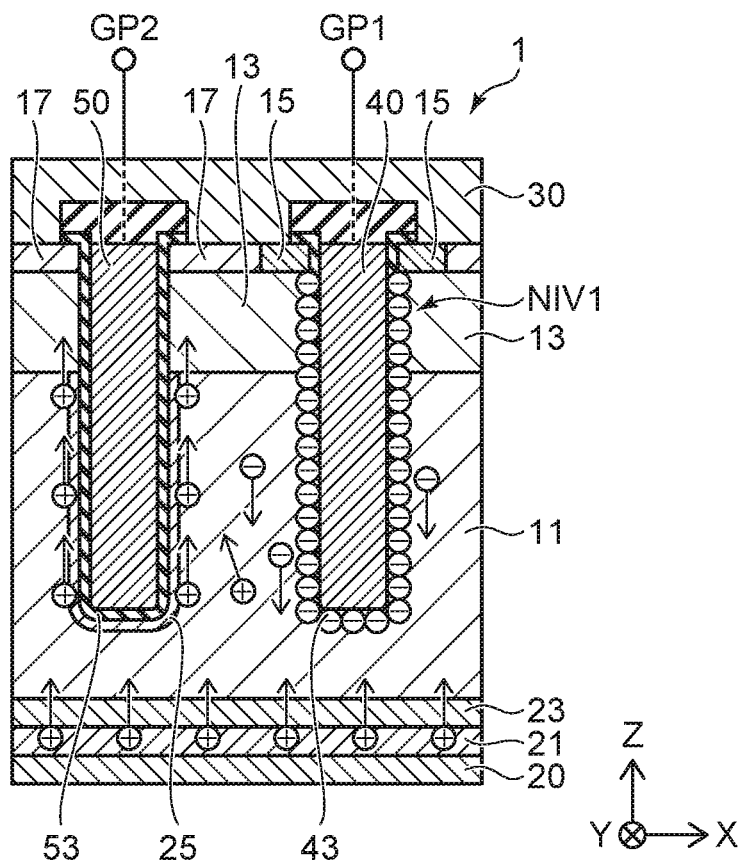

FIGS. 7A and 7B are schematic cross-sectional views showing an operation of the semiconductor device 1 according to the first embodiment. FIG. 7A is a schematic view showing the movement of carriers when turning on the semiconductor device 1 (i.e., the period from the time $t_1$ to the time $t_2$). FIG. 7B is a schematic view showing the movement of the carriers directly before turning off the semiconductor device 1 (i.e., the period from the time $t_2$ to the time $t_3$).

At turn-on shown in FIG. 7A, the first gate voltage $V_{G1}$ of positive 15 V is applied to the first control electrode 40, and the second gate voltage $V_{G2}$ of positive 15 V is applied to the second control electrode 50.

As shown in FIG. 7A, an n-type inversion layer NIV1 is induced by the potential of the first control electrode 40 at the interface between the p-type base layer 13 and the insulating film 43. Also, an n-type accumulation layer is induced at the interface between the n-type base layer 11 and the insulating film 43. Electrons are injected from the emitter electrode 30 to the n-type base layer 11 via the n-type emitter layer 15 and the n-type inversion layer NIV1. Accordingly, holes are injected from the p-type collector layer 21 to the n-type base layer 11 via the n-type buffer layer 23.

An n-type inversion layer NIV2 is induced at the interface between the p-type base layer 13 and the insulating film 53 by the potential of the second control electrode 50. The p-type charge-ejecting layer 25 is inverted to the n-type by electrons concentrating around the second control electrode 50. For example, the second gate voltage $V_{G2}$ of positive 15 V applied between the second control electrode 50 and the emitter electrode 30 is higher than the threshold voltage that induces the n-type inversion layer NIV2 at the interface between the p-type base layer 13 and the insulating film 53.

Because the p-type contact layer 17 is interposed between the n-type inversion layer NIV2 and the emitter electrode 30, electrons are not injected from the emitter electrode 30 to the n-type base layer 11 via the n-type inversion layer NIV2.

Also, because the p-type charge-ejecting layer 25 is inverted to the n-type, a depletion layer spreads inside the n-type base layer 11 positioned between the first control electrode 40 and the second control electrode 50; and the ejection path of the holes from the n-type base layer 11 to the p-type base layer 13 becomes narrow. Therefore, the ejection of the holes from the n-type base layer 11 to the emitter electrode 30 via the p-type base layer 13 is suppressed. As a result, the densities of the electrons and the holes inside the n-type base layer 11 increase, and the on-resistance of the semiconductor device 1 can be reduced.

In the state directly before the turn-off shown in FIG. 7B, the first gate voltage $V_{G1}$ of positive 15 V applied to the first control electrode 40 is maintained, and the second gate voltage $V_{G2}$ applied to the second control electrode 50 is decreased to, e.g., 0 V.

As shown in FIG. 7B, at the interface between the p-type base layer 13 and the insulating film 43, the n-type inversion layer NIV1 is maintained by the potential of the first control electrode 40, and the electron injection from the emitter electrode 30 to the n-type base layer 11 is continued.

On the other hand, the n-type inversion layer NIV2 that had been induced at the interface between the p-type base layer 13 and the insulating film 53 disappears, and the p-type charge-ejecting layer 25 returns to the p-type. Thereby, the depletion layer of the n-type base layer 11 disappears, and the holes in the n-type base layer 11 are ejected to the emitter electrode 30 via the p-type base layer 13 and the p-type contact layer 17.

The ejection of the holes from the n-type base layer 11 is promoted by the additional movement of the holes from the n-type base layer 11 to the p-type base layer 13 via the p-type charge-ejecting layer 25. Thereby, the densities of the electrons and the holes decrease in the n-type base layer 11. When turning off the semiconductor device 1 (at the time $t_3$), the time for ejecting the holes and the electrons from the n-type base layer 11 can be shortened.

Even when the p-type charge-ejecting layer 25 is not provided in the semiconductor device 1, for example, such a switching control can be performed by applying negative 15 V to the second control electrode 50. In other words, it is also possible to promote the ejection of the holes from the n-type base layer 11 by inducing the p-type inversion layer between the n-type base layer 11 and the insulating film 53 while maintaining the second gate voltage $V_{G2}$ at negative 15 V in the period at and after the time $t_2$ (referring to FIG. 6B). However, in the circuit design of the gate control circuit 60 (referring to FIG. 6A), there may be some constraints for decreasing the second gate voltage $V_{G2}$ from positive 15 V to negative 15 V.

In the semiconductor device 1 according to the embodiment, the drop amount of the second gate voltage $V_{G2}$ can be reduced by providing the p-type charge-ejecting layer 25, and thus, such constraints can be relaxed in the circuit design. In other words, it is possible to simplify the configuration of the gate control circuit 60 (referring to FIG. 6A).

When the p-type charge-ejecting layer 25 exists while turning on the semiconductor device 1 (the period from the time $t_1$ to the time $t_2$), the ejection of the holes from the n-type base layer 11 to the p-type base layer 13 is promoted. Therefore, the density of the electrons and holes inside the n-type base layer 11 decreases, and the on-resistance increases.

In the gate control circuit 60 according to the embodiment, for example, the second gate voltage $V_{G2}$ that is applied to the second control electrode 50 is set to a positive voltage at the same level as the first gate voltage $V_{G1}$ applied to the first control electrode 40 at turn-on. Thereby, the p-type charge-ejecting layer 25 is inverted to the n-type, and the ejection path of the holes via the p-type charge-ejecting layer 25 disappears. As a result, the density of the holes and the electrons can be increased in the n-type base layer 11, and the on-resistance can be reduced.

To perform such a control, the p-type charge-ejecting layer 25 has preferably the layer thickness in the direction from the insulating film 53 toward the n-type base layer 11 such that the entire p-type charge-ejecting layer 25 can be inverted to the n-type with the electrons that are concentrated at the vicinity of the insulating film 53 by the potential of the second control electrode 50.

Figure 8A:
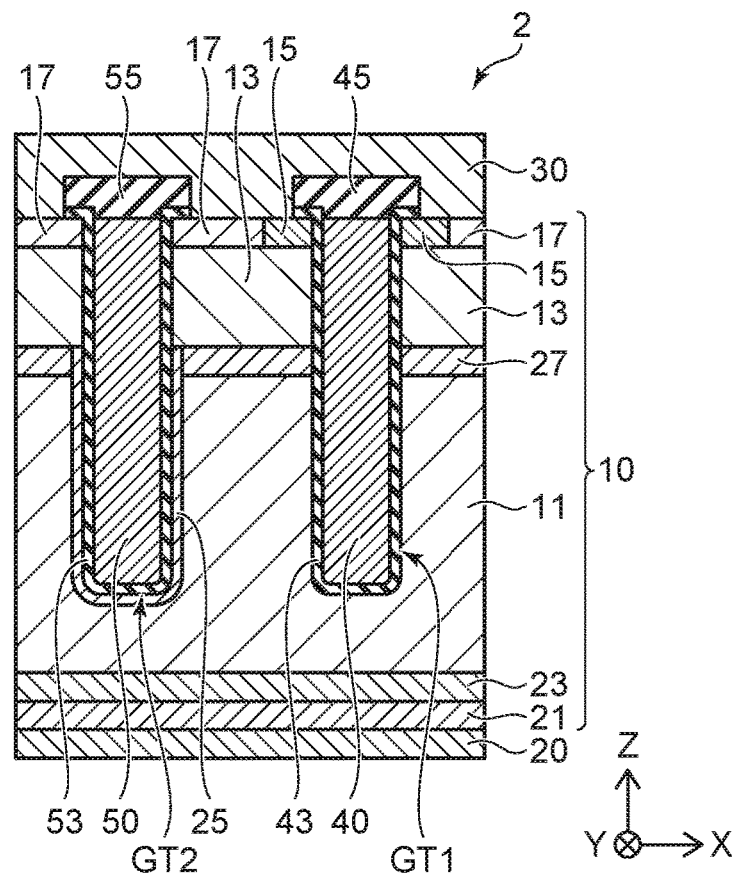
FIGS. 8A and 8B are schematic cross-sectional views showing a semiconductor device according to a first modification of the first embodiment.
Figure 8B:
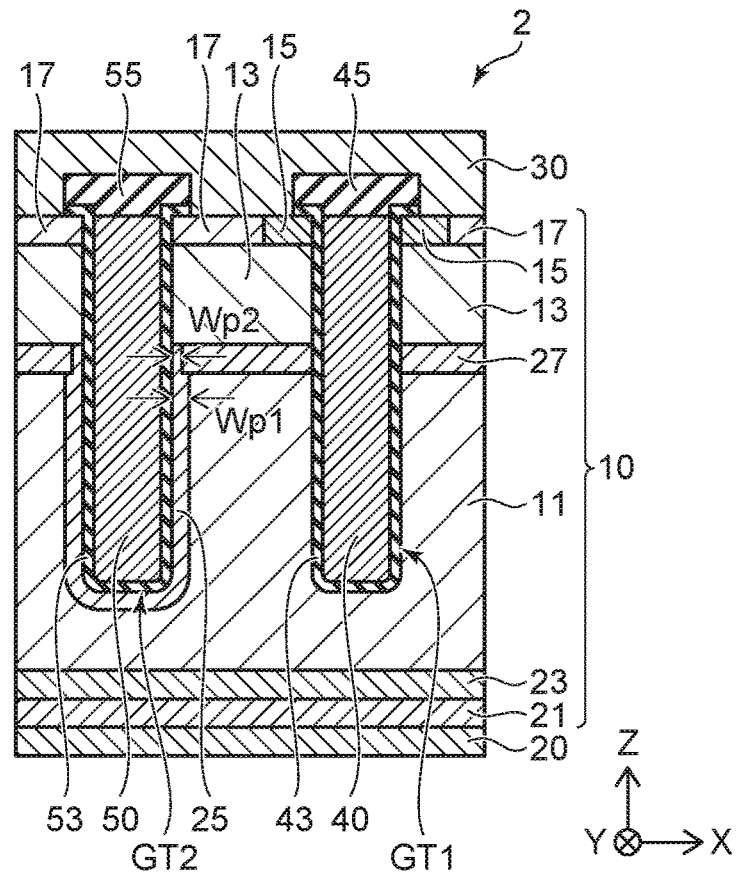

FIGS. 8A and 8B are schematic cross-sectional views showing a semiconductor device 2 according to a first modification of the first embodiment.

As shown in FIGS. 8A and 8B, the semiconductor part 10 of the semiconductor device 2 further includes a seventh semiconductor layer (hereinbelow, an n-type barrier layer 27). The n-type barrier layer 27 is provided between the n-type base layer 11 and the p-type base layer 13.

The n-type barrier layer 27 includes an n-type impurity with a higher concentration than the concentration of the n-type impurity in the n-type base layer 11. Also, the n-type barrier layer 27 includes an n-type impurity with a lower concentration than the concentration of the n-type impurity in the n-type emitter layer 15.

By providing the n-type barrier layer 27, the potential barrier to the holes is increased between the n-type base layer 11 and the p-type base layer 13, and the movement of the holes from the n-type base layer 11 to the p-type base layer 13 is suppressed. Thereby, the densities of the electrons and the holes in the n-type base layer 11 increase at turn-on, and the on-resistance can be reduced.

The p-type charge-ejecting layer 25 extends between the n-type barrier layer 27 and the insulating film 53, and is linked to the p-type base layer 13. For example, the p-type charge-ejecting layer 25 includes a p-type impurity with a higher concentration than the concentration of the n-type impurity in the n-type barrier layer 27.

In the example shown in FIG. 8B, the p-type charge-ejecting layer 25 includes a portion having a width Wp1 between the n-type base layer 11 and the second control electrode 50. Moreover, the p-type charge-ejecting layer 25 includes another portion having a width Wp2 between the n-type barrier layer 27 and the second control electrode. The width Wp1 is greater than the width Wp2.

For example, also in the switching control of the semiconductor device 2, the first gate voltage $V_{G1}$ shown in FIG. 6B is applied between the emitter electrode 30 and the first control electrode 40; and the second gate voltage $V_{G2}$ shown in FIG. 6C is applied between the emitter electrode 30 and the second control electrode 50. The p-type charge-ejecting layer 25 also is provided in this example, and the drop amount of the second gate voltage $V_{G2}$ can be reduced at the time $t_2$ (referring to FIG. 6C). Thus, the gate control circuit 60 can be provided with the simple configuration.

Figure 9:
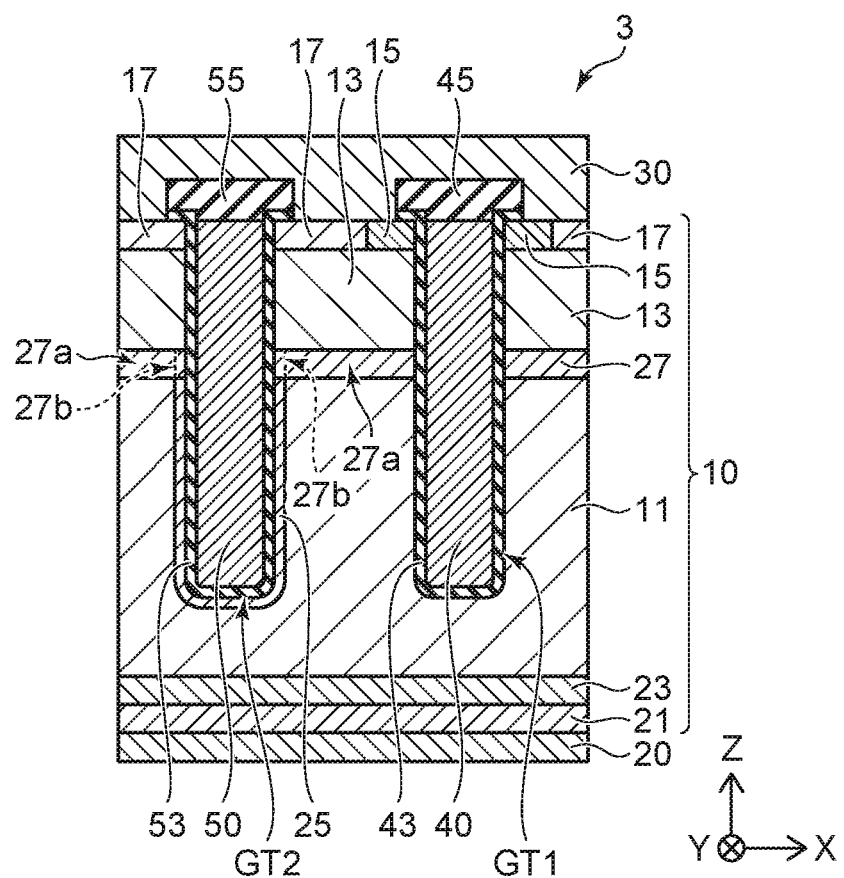
FIG. 9 is a schematic cross-sectional view showing a semiconductor device according to a second modification of the first embodiment.

FIG. 9 is a schematic cross-sectional view showing a semiconductor device 3 according to a second modification of the first embodiment.

As shown in FIG. 9, the semiconductor part 10 of the semiconductor device 3 further includes the n-type barrier layer 27. The n-type barrier layer 27 is provided between the n-type base layer 11 and the p-type base layer 13. The n-type barrier layer 27 includes a first region 27a and a second region 27b. The second region 27b is positioned between the first region 27a and the insulating film 53. The electron density in the first region 27a is greater than the electron density in the second region 27b.

In the example, the n-type barrier layer 27 is provided between the p-type base layer 13 and the p-type charge-ejecting layer 25, and the p-type charge-ejecting layer 25 is not linked to the p-type base layer 13. For example, the n-type impurity in the second region 27b of the n-type barrier layer 27 is compensated by the p-type impurity of the p-type diffusion layer 103 (referring to FIG. 4A). Therefore, the electron density in the second region 27b is less than the electron density in the first region 27a.

Figure 10A:
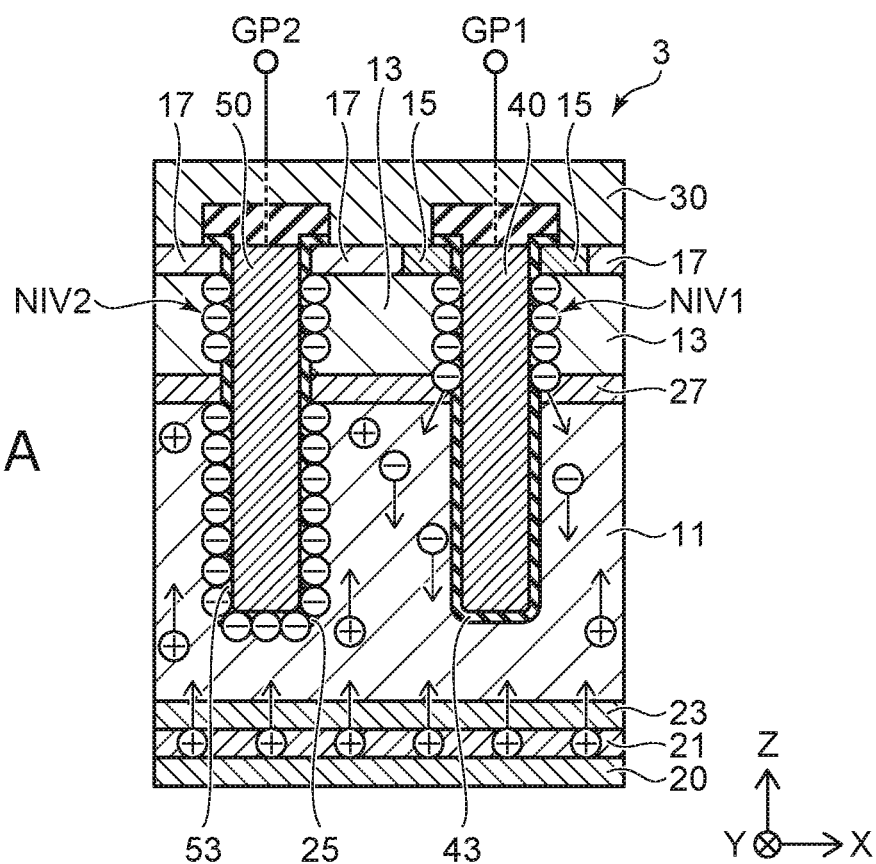
FIGS. 10A and 10B are schematic cross-sectional views showing an operation of the semiconductor device according to the second modification of the first embodiment.
Figure 10B:
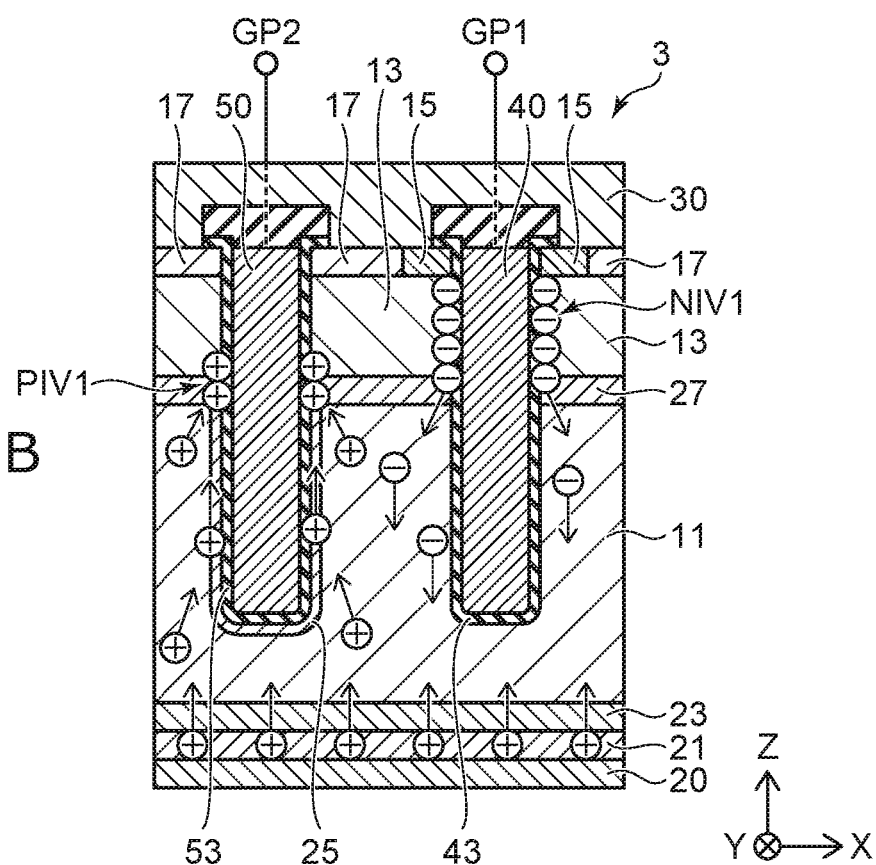

FIGS. 10A and 10B are schematic cross-sectional views showing an operation of the semiconductor device 3 according to the second modification of the first embodiment. Also, in the semiconductor device 3, the first gate voltage $V_{G1}$ shown in FIG. 6B is applied between the emitter electrode 30 and the first control electrode 40; and the second gate voltage $V_{G2}$ shown in FIG. 6C is applied between the emitter electrode 30 and the second control electrode 50.

FIG. 10A is a schematic view showing the movement of the carriers when turning on the semiconductor device 3 (i.e., the period from the time $t_1$ to the time $t_2$). During the turn-on period, the first gate voltage $V_{G1}$ of positive 15 V is applied to the first control electrode 40, and the second gate voltage $V_{G2}$ of positive 15 V is applied to the second control electrode 50.

As shown in FIG. 10A, at the interface between the p-type base layer 13 and the insulating film 43, the n-type inversion layer NIV1 is induced by the potential of the first control electrode 40. Thereby, electrons are injected from the emitter electrode 30 to the n-type base layer 11 via the n-type emitter layer 15, the n-type inversion layer NIV1, and the n-type barrier layer 27. Accordingly, holes are injected from the p-type collector layer 21 to the n-type base layer 11 via the n-type buffer layer 23.

The n-type inversion layer NIV2 is induced at the interface between the p-type base layer 13 and the insulating film 53 by the potential of the second control electrode 50. Also, the p-type charge-ejecting layer 25 is inverted to the n-type with electrons concentrated around the second control electrode 50.

Because the p-type contact layer 17 is interposed between the n-type inversion layer NIV2 and the emitter electrode 30, electrons are not injected from the emitter electrode 30 to the n-type base layer 11 via the n-type inversion layer NIV2.

Also, because the p-type charge-ejecting layer 25 is inverted to the n-type, a depletion layer spreads inside the n-type base layer 11 positioned between the first control electrode 40 and the second control electrode 50, and thus, the ejection path of the holes from the n-type base layer 11 to the p-type base layer 13 becomes narrow. The ejection of holes from the n-type base layer 11 to the emitter electrode 30 via the p-type base layer 13 is suppressed thereby. As a result, the densities of the electrons and the holes increase in the n-type base layer 11, and the on-resistance is reduced.

FIG. 10B is a schematic view showing the movement of the carriers directly before turning off the semiconductor device 3 (i.e., the period from the time $t_2$ to the time $t_3$). During the period directly before turn-off, the first gate voltage $V_{G1}$ of the first control electrode 40 is maintained at positive 15 V, and the second gate voltage $V_{G2}$ applied to the second control electrode 50 is reduced to, for example, negative 5 V.

As shown in FIG. 10B, at the interface between the p-type base layer 13 and the insulating film 43, the n-type inversion layer NIV1 is induced by the potential of the first control electrode 40, and the electron injection from the emitter electrode 30 to the n-type base layer 11 is continued.

At the interface between the p-type base layer 13 and the insulating film 53, the n-type inversion layer NIV2 disappears, and the p-type charge-ejecting layer 25 returns to the p-type. Also, a p-type inversion layer PIV1 is induced at the interface between the n-type barrier layer 27 and the insulating film 53. In other words, since the electron density in the second region 27b of the n-type barrier layer 27 is reduced, the p-type inversion layer PIV1 can be induced by reducing the potential of the second control electrode 50, for example, from positive 15 V to negative 5 V.

The p-type inversion layer PIV1 electrically connects the p-type base layer 13 and the p-type charge-ejecting layer 25 and promotes the movement of the holes from the n-type base layer 11 to the p-type base layer 13. Thereby, the densities of the electrons and the holes in the n-type base layer 11 can be reduced beforehand, and the switching loss can be reduced in the turn-off period.

Also, in the example, the drop amount of the second gate voltage $V_{G2}$ can be reduced. Accordingly, it is possible to relax the constraints of the gate control circuit 60 (referring to FIG. 6A) for reducing the switching loss.

Second Embodiment

Figure 11:
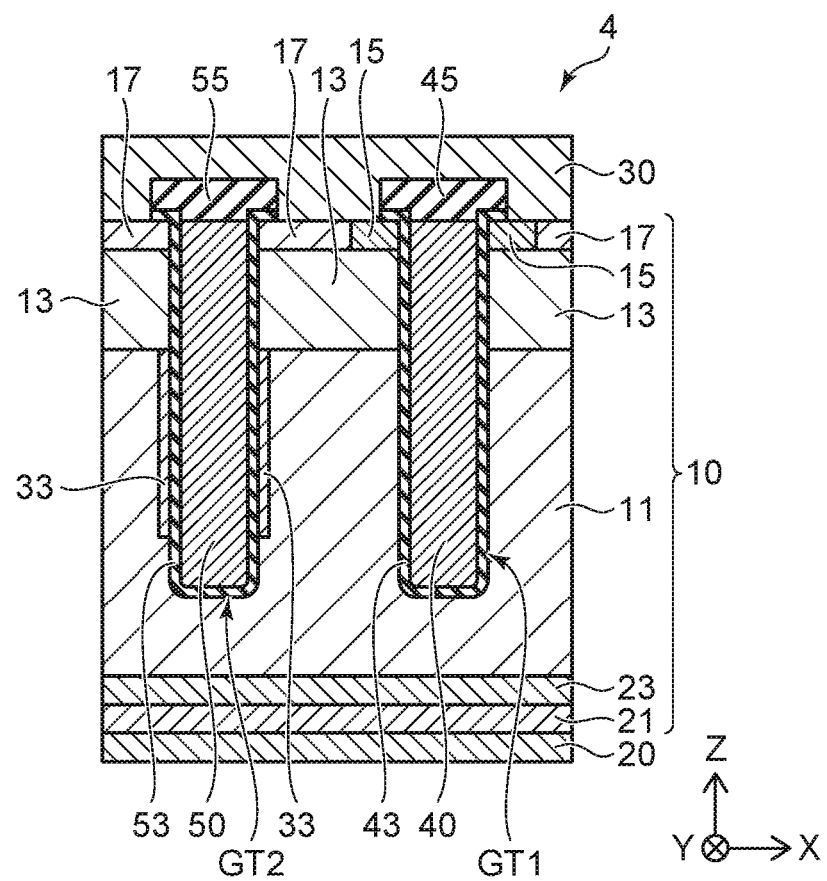
FIG. 11 is a schematic cross-sectional view showing a semiconductor device according to a second embodiment.

FIG. 11 is a schematic cross-sectional view showing a semiconductor device 4 according to a second embodiment.

As shown in FIG. 11, a p-type charge-ejecting layer 33 of the semiconductor device 4 is provided between the n-type base layer 11 and the insulating film 53. The p-type charge-ejecting layer 33 extends along the side surface of the second control electrode 50. The p-type charge-ejecting layer 33 is linked to the p-type base layer 13. The p-type charge-ejecting layer 33 is not provided at the bottom portion of the gate trench GT2.

Also, in the semiconductor device 4, the first gate voltage $V_{G1}$ shown in FIG. 6B is applied between the emitter electrode 30 and the first control electrode 40, and the second gate voltage $V_{G2}$ shown in FIG. 6C is applied between the emitter electrode 30 and the second control electrode 50.

The p-type charge-ejecting layer 33 is provided so that the entire p-type charge-ejecting layer 33 is inverted to the n-type when the second control electrode 50 has a positive potential. In the example, the gate control circuit 60 (referring to FIG. 6A) also can be provided with the simplified configuration by providing the p-type charge-ejecting layer 33.

Figure 12A:
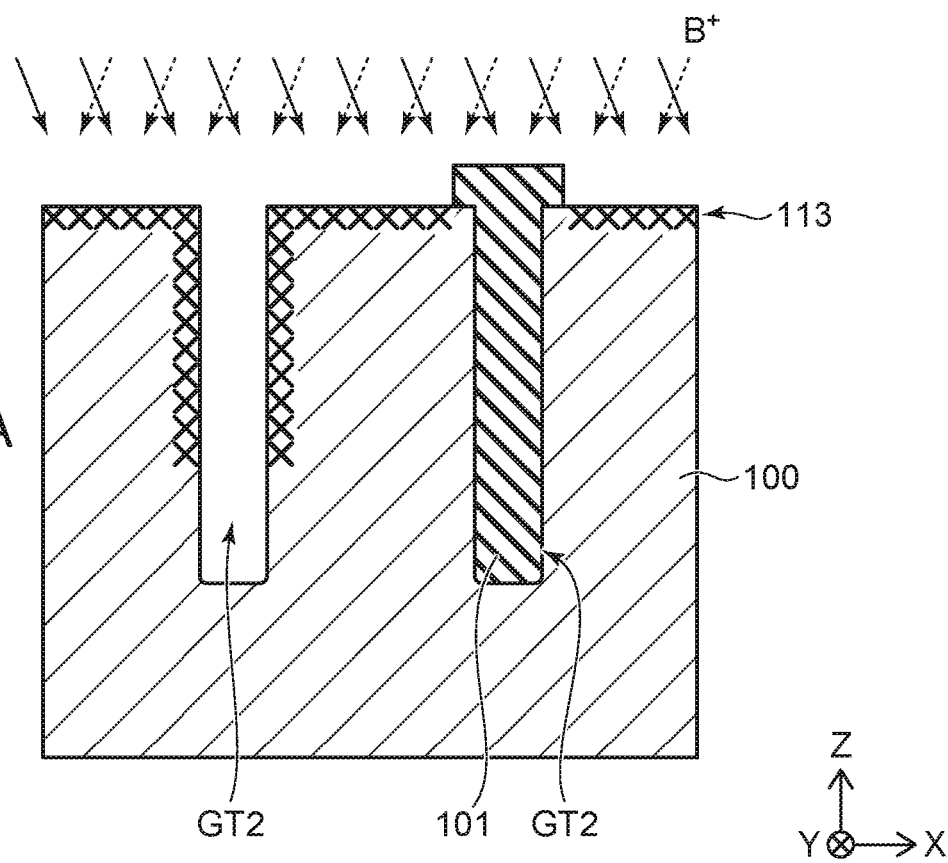
FIGS. 12A and 12B are schematic cross-sectional views showing manufacturing processes of the semiconductor device according to the second embodiment.
Figure 12B:
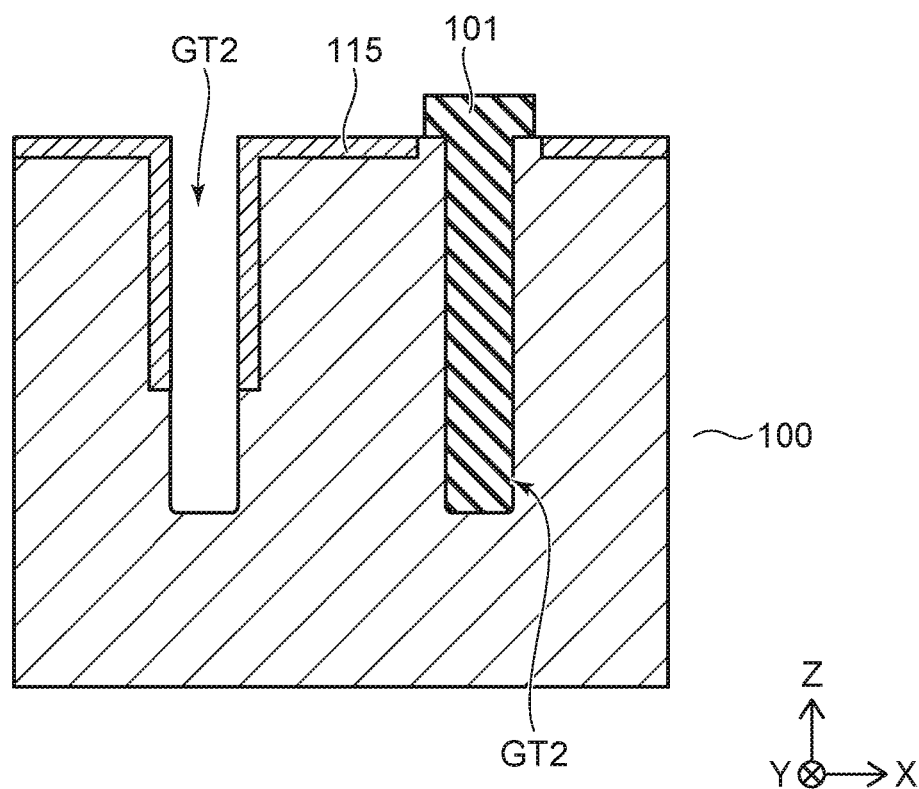

FIGS. 12A and 12B are schematic cross-sectional views showing manufacturing processes of the semiconductor device 4 according to the second embodiment. FIGS. 12A and 12B illustrate manufacturing processes that replace the process shown in FIG. 3A.

As shown in FIG. 12A, an implantation layer 113 is formed by ion-implanting a p-type impurity such as boron (B) into the front side of the semiconductor wafer 100. The gate trench GT1 and the gate trench GT2 are formed in the front side of the semiconductor wafer 100. The insulating film 101 fills the internal space of the gate trench GT1.

In the process shown in FIG. 12A, for example, the p-type impurity is ion-implanted into the front surface of the semiconductor wafer 100 at a prescribed implantation angle. The implantation layer 113 is formed along the inner wall of the gate trench GT2, but is not formed at the bottom portion of the gate trench GT2.

As shown in FIG. 12B, a p-type region 115 is formed with the p-type impurity activated by heat treatment. The semiconductor device 4 is completed through the processes continuing from FIG. 3A. The p-type region 115 includes a portion formed along the inner wall of the gate trench GT2 as the p-type charge-ejecting layer 33.

Figure 13:
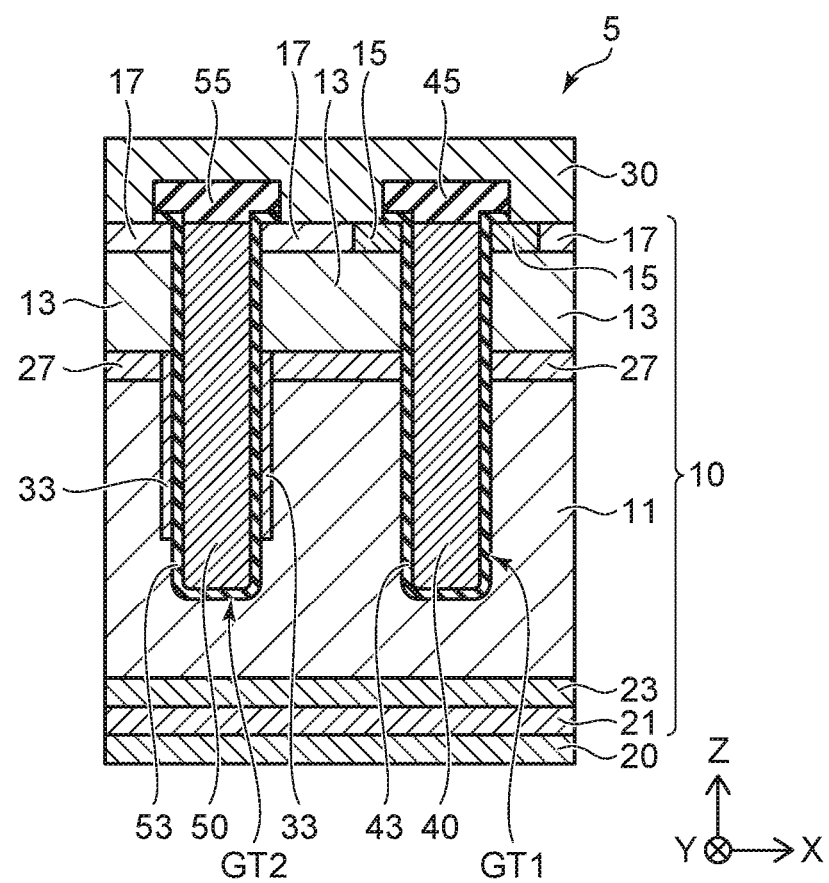
FIG. 13 is a schematic cross-sectional view showing a semiconductor device according to a first modification of the second embodiment.

FIG. 13 is a schematic cross-sectional view showing a semiconductor device 5 according to a first modification of the second embodiment. As shown in FIG. 13, the semiconductor part 10 of the semiconductor device 5 further includes the n-type barrier layer 27, The p-type charge-ejecting layer 33 extends between the n-type barrier layer 27 and the insulating film 53 and is linked to the p-type base layer 13.

Also, in the example, the first gate voltage $V_{G1}$ shown in FIG. 6B is applied between the emitter electrode 30 and the first control electrode 40; and the second gate voltage $V_{G2}$ shown in FIG. 6C is applied between the emitter electrode 30 and the second control electrode 50. By providing the p-type charge-ejecting layer 33, the drop amount of the second gate voltage $V_{G2}$ can be reduced at the time $t_2$, and thus, the gate control circuit 60 (referring to FIG. 6A) can be provided with the simplified configuration.

Figure 14:
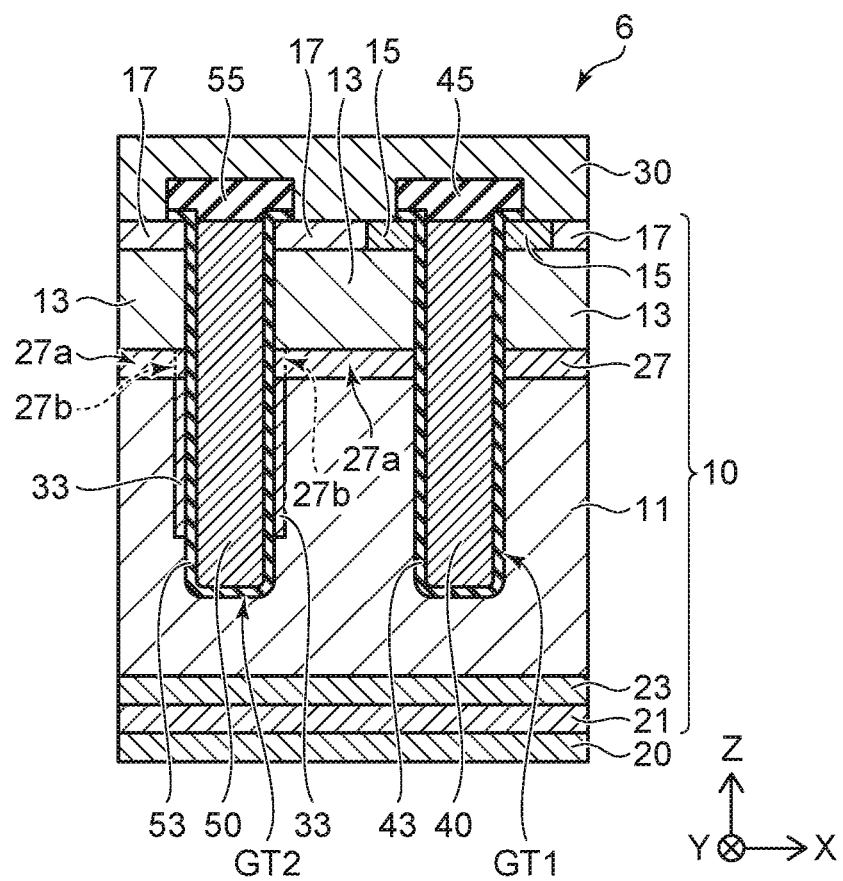
FIG. 14 is a schematic cross-sectional view showing a semiconductor device according to a second modification of the second embodiment.

FIG. 14 is a schematic cross-sectional view showing a semiconductor device 6 according to a second modification of the second embodiment. As shown in FIG. 14, the semiconductor part 10 of the semiconductor device 6 further includes the n-type barrier layer 27. The n-type barrier layer 27 is provided between the n-type base layer 11 and the p-type base layer 13. The n-type barrier layer 27 includes the first region 27a and the second region 27b. The second region 27b is provided between the first region 27a and the insulating film 53. The electron density in the first region 27a is greater than the electron density in the second region 27b.

Since the n-type barrier layer 27 is provided between the p-type base layer 13 and the p-type charge-ejecting layer 25, the p-type charge-ejecting layer 25 is not linked to the p-type base layer 13. For example, the n-type impurity in the second region 27b of the n-type barrier layer 27 is compensated by the p-type impurity in the p-type region 115 (referring to FIG. 12B). Therefore, the electron density in the second region 27b is less than the electron density in the first region 27a.

Also, in the example, the first gate voltage $V_{G1}$ shown in FIG. 6B is applied between the emitter electrode 30 and the first control electrode 40; and a gate voltage that is controlled similarly to the second gate voltage $V_{G2}$ shown in FIG. 6C is applied between the emitter electrode 30 and the second control electrode 50.

For example, the gate voltage $V_{G2}$ of negative 5 V is applied between the emitter electrode 30 and the second control electrode 50 directly before the turn-off period (i.e., the period from the time $t_2$ to the time $t_3$). Thereby, the p-type inversion layer PIV1 (referring to FIG. 10B) is induced between the n-type barrier layer 27 and the insulating film 53, and the p-type base layer 13 and the p-type charge-ejecting layer 33 are electrically connected to each other. As a result, the ejection of the holes from the n-type base layer 11 to the p-type base layer 13 can be promoted, and the turn-off loss of the semiconductor device 6 can be reduced.

Thus, by providing the p-type charge-ejecting layer 33, for example, the drop amount of the gate voltage $V_{G2}$ of the second control electrode 50 can be reduced at the time $t_2$ (referring to FIG. 6C), and the gate control circuit 60 can be provided with the simplified configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part having first and second trenches at a front side;
a first electrode provided at a backside of the semiconductor part;
a second electrode provided at the front side of the semiconductor part;
a first control electrode provided between the semiconductor part and the second electrode, the first control electrode provided in the first trench, the first control electrode being electrically insulated from the semiconductor part by a first insulating film and electrically insulated from the second electrode by a second insulating film; and
a second control electrode provided between the semiconductor part and the second electrode, the second control electrode provided in the second trench, the second control electrode being electrically insulated from the semiconductor part by a third insulating film and electrically insulated from the second electrode by a fourth insulating film, the second control electrode being electrically isolated from the first control electrode,
the semiconductor part including a first semiconductor layer of a first conductivity type, a second semiconductor layer of a second conductivity type, a third semiconductor layer of the first conductivity type, a fourth semiconductor layer of the second conductivity type, a fifth semiconductor layer of the second conductivity type, and a sixth semiconductor layer of the second conductivity type,
the first and second control electrodes extending into the first semiconductor layer,
the second semiconductor layer being provided between the first semiconductor layer and the second electrode, the second semiconductor layer facing the first control electrode via the first insulating film and facing the second control electrode via the third insulating film,
the third semiconductor layer being selectively provided between the second semiconductor layer and the second electrode, the third semiconductor layer contacting the first insulating film and being electrically connected to the second electrode,
the fourth semiconductor layer being selectively provided between the second semiconductor layer and the second electrode, the fourth semiconductor layer directly contacting the third insulating film and being electrically connected to the second electrode,
the fifth semiconductor layer being provided between the first semiconductor layer and the first electrode, the fifth semiconductor layer being electrically connected to the first electrode,
the sixth semiconductor layer being provided between the first semiconductor layer and the second control electrode, the sixth semiconductor layer extending along the third insulating film.

2. The device according to claim 1, wherein
the sixth semiconductor layer has a first thickness in a direction from the third insulating film toward the first semiconductor layer, and
the first thickness is provided to invert the entire sixth semiconductor layer to the first conductivity type when the first-conductivity-type carriers are concentrated between the first semiconductor layer and the third insulating film by a voltage applied between the second control electrode and the second electrode.

3. The device according to claim 1, wherein
the sixth semiconductor layer includes a portion provided between the first semiconductor layer and a bottom of the second trench, and
the portion of the sixth semiconductor layer directly contacts the third insulating film at the bottom of the second trench.

4. The device according to claim 1, wherein
the semiconductor part further includes a seventh semiconductor layer of the first conductivity type provided between the first and second semiconductor layers, the seventh semiconductor layer including a first-conductivity-type impurity with a higher concentration than a concentration of a first-conductivity-type impurity in the first semiconductor layer, and
the concentration of the first-conductivity-type impurity in the seventh semiconductor layer is less than a concentration of a first-conductivity-type impurity in the third semiconductor layer.

5. The device according to claim 4, wherein
the seventh semiconductor layer includes a first region and a second region, the second region including a first conductivity-type carrier with a lower concentration than a concentration of a first conductivity-type carrier in the first region, and
the second region is positioned between the first region and the third insulating film and between the second and sixth semiconductor layers.

6. The device according to claim 4, wherein
the sixth semiconductor layer includes a first portion and a second portion, the first portion being provided between the first semiconductor layer and the third insulating film, the second portion being provided between the seventh semiconductor layer and the third insulating film.

7. The device according to claim 6, wherein
The first portion of the sixth semiconductor layer has a first width in a direction from the first control electrode toward the second control electrode, and the second portion of the sixth semiconductor layer has a second width in the same direction, the second width being less than the first width.

8. The device according to claim 1, further comprising a control circuit applying control voltages between the first control electrode and the second electrode and between the second control electrode and the second electrode.

9. The device according to claim 7, wherein
the control circuit is configured to apply a first voltage and a second voltage respectively between the second electrode and the first control electrode and between the second electrode and the second control electrode, the first voltage being higher than a threshold voltage of the first and second control electrodes, the second voltage being zero volts or a positive voltage lower than the threshold voltage.

10. The device according to claim 1, wherein
the second control electrode includes a first control portion facing the second semiconductor layer of the semiconductor part via the third insulating film, an end portion at the first electrode side of the second control electrode, and a second control portion positioned between the first portion and the end portion, and
the sixth semiconductor layer faces the second portion of the second control electrode via the third insulating film.

11. The device according to claim 10, wherein
the semiconductor part further includes a seventh semiconductor layer of the first conductivity type provided between the first and second semiconductor layers, the seventh semiconductor layer including a first-conductivity-type impurity with a higher concentration than a concentration of a first-conductivity-type impurity in the first semiconductor layer, and
the concentration of the first-conductivity-type impurity of the seventh semiconductor layer is less than a concentration of a first-conductivity-type impurity of the third semiconductor layer.

12. The device according to claim 11, wherein
the seventh semiconductor layer includes a first region and a second region, the second region including a first conductivity-type carrier with a lower concentration than a concentration of a first conductivity-type carrier in the first region, and
the second region is positioned between the first region and the third insulating film and positioned between the second and sixth semiconductor layers.

13. The device according to claim 11, wherein
the sixth semiconductor layer includes a first portion and a second portion, the first portion being provided between the first semiconductor layer and the third insulating film, the second portion being positioned between the seventh semiconductor layer and the third insulating film.

14. The device according to claim 1, wherein
the third insulating film includes a portion positioned between the second control electrode and the sixth semiconductor layer, the portion of the third insulating film including a same element as a second-conductivity-type impurity element of the sixth semiconductor layer.

15. A semiconductor device, comprising:
a semiconductor part having first and second trenches at a front side;
a first electrode provided at a backside of the semiconductor part;
a second electrode provided at the front side of the semiconductor part;
a first control electrode provided between the semiconductor part and the second electrode, the first control electrode provided in the first trench, the first control electrode being electrically insulated from the semiconductor part by a first insulating film and electrically insulated from the second electrode by a second insulating film; and
a second control electrode provided between the semiconductor part and the second electrode, the second control electrode provided in the second trench, the second control electrode being electrically insulated from the semiconductor part by a third insulating film and electrically insulated from the second electrode by a fourth insulating film, the second control electrode being electrically isolated from the first control electrode,
the semiconductor part including a first semiconductor layer of a first conductivity type, a second semiconductor layer of a second conductivity type, a third semiconductor layer of the first conductivity type, a fourth semiconductor layer of the second conductivity type, a fifth semiconductor layer of the second conductivity type, and a sixth semiconductor layer of the second conductivity type,
the first and second control electrodes extending into the first semiconductor layer,
the second semiconductor layer being provided between the first semiconductor layer and the second electrode, the second semiconductor layer facing the first control electrode via the first insulating film and facing the second control electrode via the third insulating film,
the third semiconductor layer being selectively provided between the second semiconductor layer and the second electrode, the third semiconductor layer contacting the first insulating film and being electrically connected to the second electrode,
the fourth semiconductor layer being selectively provided between the second semiconductor layer and the second electrode, the fourth semiconductor layer contacting the third insulating film and being electrically connected to the second electrode,
the fifth semiconductor layer being provided between the first semiconductor layer and the first electrode, the fifth semiconductor layer being electrically connected to the first electrode,
the sixth semiconductor layer being provided between the first semiconductor layer and the second control electrode, the sixth semiconductor layer extending along the third insulating film,
the sixth semiconductor layer including a portion provided between the first semiconductor layer and a bottom of the second trench, the portion of the sixth semiconductor layer directly contacting the third insulating film at the bottom of the second trench.

16. The device according to claim 15, wherein
the second semiconductor layer including a portion directly contacting the third insulating film, the portion of the second semiconductor layer being positioned between the fourth semiconductor layer and the sixth semiconductor layer.

* * * * *